United States Patent
Koo et al.

(10) Patent No.: US 7,538,480 B2
(45) Date of Patent: May 26, 2009

(54) ORGANIC THIN FILM TRANSISTOR AND FLAT PANEL DISPLAY DEVICE INCLUDING THE SAME

(75) Inventors: Jae-Bon Koo, Suwon-si (KR); Min-Chul Suh, Suwon-si (KR); Kyong-Do Kim, Suwon-si (KR); Yeon-Gon Mo, Suwon-si (KR)

(73) Assignee: Samsung Mobile Display Co., Ltd., Suwon (KR)

( * ) Notice: Subject to any disclaimer, the term of this patent is extended or adjusted under 35 U.S.C. 154(b) by 541 days.

(21) Appl. No.: 11/196,241

(22) Filed: Aug. 4, 2005

(65) Prior Publication Data

US 2006/0028130 A1    Feb. 9, 2006

(30) Foreign Application Priority Data

Aug. 5, 2004    (KR) .................. 10-2004-0061669

(51) Int. Cl.
*H01J 19/00* (2006.01)
*H05B 33/00* (2006.01)

(52) U.S. Cl. .................. 313/500; 313/506; 257/12; 257/192

(58) Field of Classification Search .............. None
See application file for complete search history.

(56) References Cited

U.S. PATENT DOCUMENTS 7,250,928 B2 *    7/2007    Yamazaki et al. ............. 345/76
2003/0206144 A1 *    11/2003    Yudasaka .................... 345/55

FOREIGN PATENT DOCUMENTS

| CN | 1476111 | 2/2004 |
|----|---------|--------|
| CN | 1477912 | 2/2004 |
| JP | 04-199638 | 7/1992 |
| JP | 2002-169190 | 6/2002 |
| JP | 2003-229616 | 8/2003 |
| JP | 2003-241689 | 8/2003 |
| JP | 2004-055653 | 2/2004 |
| KR | 2001-0006448 A1 | 1/2001 |
| KR | 1020020084427 A1 | 11/2002 |

OTHER PUBLICATIONS

Chinese Office Action dated Nov. 21, 2008 for CN Application No. 200510091070.3.

* cited by examiner

*Primary Examiner*—Ashok Patel
(74) *Attorney, Agent, or Firm*—H.C. Park & Associates, PLC

(57) ABSTRACT

Provided are an organic thin film transistor (TFT), which can prevent deformation or separation due to mechanical stress, and a flat panel display device including the organic TFT. The organic TFT includes a gate electrode; a source electrode and drain electrodes insulated from the gate electrode; an organic semiconductor layer insulated from the gate electrode, and contacting the source electrode and the drain electrodes; and a gate insulating layer insulating the gate electrode from the source electrode, the drain electrode, and the organic semiconductor layer. The gate insulating layer may be patterned in an island shape to permit adjacent portions of the substrate to flex freely, thereby reducing stress and deformation of the organic TFT and its component layers.

21 Claims, 9 Drawing Sheets

ORGANIC THIN FILM TRANSISTOR AND FLAT PANEL DISPLAY DEVICE INCLUDING THE SAME

CROSS-REFERENCE TO RELATED APPLICATIONS

This application claims the priority of Korean Patent Application No. 10-2004-0061669, filed on Aug. 5, 2004, in the Korean Intellectual Property Office, the disclosure of which is herein incorporated by reference in its entirety.

BACKGROUND OF THE INVENTION

The present invention relates to an organic thin film transistor (TFT) and a flat panel display device including the organic TFT, and more particularly, to an organic TFT which resists distortion or separation by mechanical stress, and a flat panel display device including the organic TFT.

DESCRIPTION OF THE RELATED ART

The development of polyacetylene, a conjugated organic high polymer with semiconductor characteristics, has inspired much research into using organic material for transistors in various fields such as functional electronic devices and optical devices. Organic material gives the advantages of the manufacturer's choice of various synthesizing methods, moldability into fibers or films, as well as flexibility, conductivity, and low fabricating cost.

Conventional silicon thin film transistors (TFTs) include a silicon semiconductor layer having a source region and a drain region doped with impurities of high concentration. A channel region is formed between these two regions; a gate electrode is insulated from the semiconductor layer and located on a region corresponding to the channel region; and a source electrode and a drain electrode are insulated from the gate electrode but contact the source and drain regions respectively. However, a conventional silicon TFT is expensive to manufacture, is fragile, and cannot use a plastic substrate since it is fabricated at high temperature, for example, 300° C. or higher.

Flat panel display devices such as liquid crystal displays (LCD) or electroluminescent displays (ELD) use TFTs as switching devices and driving devices for controlling and operating pixels. In order to make flat panel display devices large, thin, and flexible, researchers are trying to use plastic for the substrate instead of glass. However, plastic substrates are difficult to manufacture because the display device must be fabricated at a low temperature, below what is necessary for conventional silicon TFTs.

Since an organic TFT semiconductor layer solves the above problems, active research is performed into developing organic TFTs for the organic semiconductor layer.

FIGS. 1, 2, and 3 are cross-sectional views of a conventional inverted coplanar type organic TFT, an inverted staggered type organic TFT, and a staggered type organic TFT, respectively.

Referring to FIG. 1, a gate electrode 14 is located on an upper portion of a substrate 12, and a gate insulating layer 18 is located on the entire surface of the substrate 12 so as to cover the gate electrode 14. In addition, a source electrode 15 and a drain electrode 16 are located on the gate insulating layer 18, and an organic semiconductor layer 17 is located on the entire surface of the substrate 12 so as to cover the source electrode 15 and drain electrode 16. Referring to FIG. 2, reference numeral 24 denotes a gate electrode, reference numeral 25 denotes a source electrode, and reference numeral 26 denotes a drain electrode. Referring to FIG. 3, reference numeral 34 denotes a gate electrode, reference numeral 35 denotes a source electrode; and reference numeral 36 denotes a drain electrode. In the inverted staggered type TFT and the staggered type TFT shown in FIGS. 2 and 3 respectively, the positions of the basic elements are the same as those of FIG. 1, but their layout is inverted.

For example, referring to FIGS. 1, 2, and 3, in the above structures, the organic semiconductor layer 17, 27, or 37 and the gate insulating layer 18, 28, or 38 are located on the entire surface of the substrate 12, 22, or 32, and flexibility is best when the organic semiconductor layer 17, 27, or 37 and the gate insulating layer 18, 28, or 38 are both formed of organic material. However, the gate insulating layer 18, 28, or 38 greatly affects the electronic characteristics of the TFT. While it is desirable that the leakage current is $10^{-10}$ A or less and the breakdown voltage is 5 MV/cm or more, it is difficult to satisfy these requirements using organic material. Consequently, an inorganic material such as silicon oxide (SiOx) or silicon nitride (SiNx) is usually used as the gate insulating layer in an organic TFT. However, the gate insulating layer formed of inorganic material has inferior flexibility, and the TFT may be transformed or separated due to mechanical stress.

A solution is needed that affords an organic TFT having improved flexibility and material characteristics that resist deformation or separation caused by mechanical stress.

SUMMARY OF THE INVENTION

The present invention provides an organic thin film transistor (TFT) which resists deformation or separation by mechanical stress, and a flat panel display device including the organic TFT.

According to an aspect of the present invention, there is provided an organic thin film transistor that may include: a gate electrode; a source electrode and a drain electrode, both insulated from the gate electrode; an organic semiconductor layer insulated from the gate electrode, and contacting the source electrode and the drain electrode; and a gate insulating layer insulating the gate electrode from the source electrode, the drain electrode, and the organic semiconductor layer, wherein the gate insulating layer is patterned in an island shape.

The gate insulating layer may be formed of an inorganic material.

The gate electrode may be located on a substrate, the gate insulating layer may cover the gate electrode, the source and drain electrodes may be formed on the gate insulating layer, and the organic semiconductor layer may cover the source and the drain electrodes.

The gate electrode may be formed on the substrate, the gate insulating layer may cover the gate electrode, the organic semiconductor layer may be formed on the gate insulating layer, and the source electrode and the drain electrode may be formed on the organic semiconductor layer.

The organic thin film transistor may be formed on a flexible substrate.

The gate insulating layer may be patterned so as to correspond to each organic thin film transistor.

According to another aspect of the present invention, there is provided a flat panel display device that may include: a gate electrode; a source electrode and a drain electrode, both insulated from the gate electrode; an organic semiconductor layer insulated from the gate electrode, and contacting the source electrode and the drain electrode; a gate insulating layer insulating the gate electrode from the source electrode, the drain electrode, and the organic semiconductor layer; and a display element electrically connected to at least one of the source electrode and the drain electrode, wherein the gate insulating layer is patterned in an island shape.

The gate insulating layer is patterned so as to correspond to each organic thin film transistor including the source electrode, the drain electrode and the gate electrode.

The display element may emit one of red, green, and blue light, and the gate insulating layer may be patterned so as to correspond to each display element.

The display element may emit one of red, green, and blue light, and the gate insulating layer may be patterned so as to correspond to three neighboring display elements, which respectively emit red, green, and blue light.

The display element may be an electroluminescent element.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE INVENTION

Figure 4:
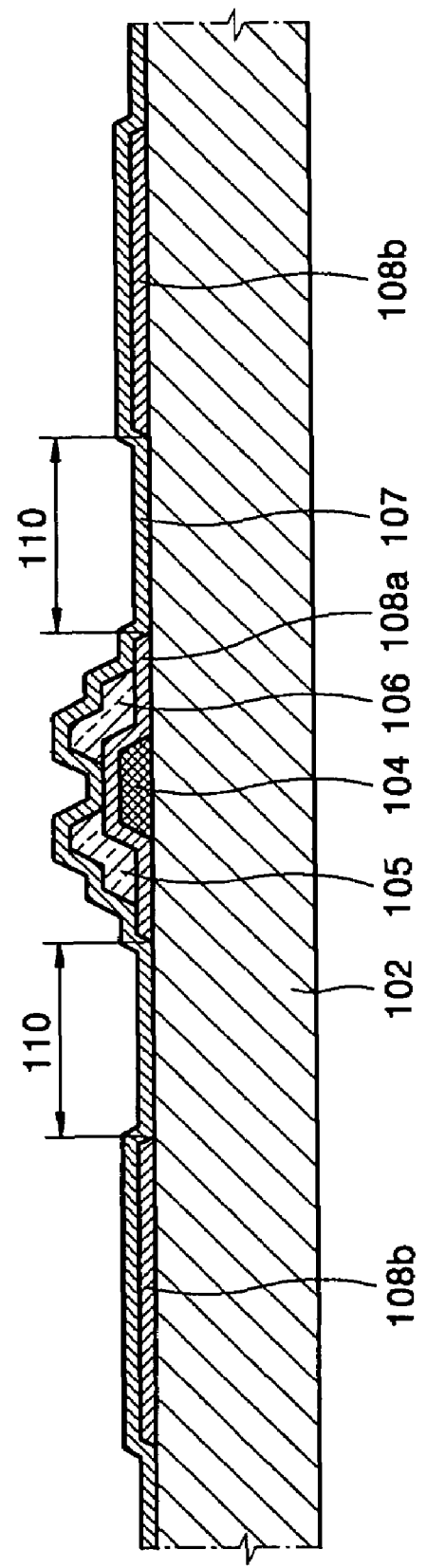
FIG. 4 is a schematic cross-sectional view of an inverted coplanar type organic TFT according to the present invention.

FIG. 4 is a schematic cross-sectional view of an inverted coplanar type organic thin film transistor (TFT) according to the present invention. Referring to FIG. 4, a source electrode 105 and a drain electrode 106 are insulated from a gate electrode 104. In addition, an organic semiconductor layer 107 is insulated from the gate electrode 104 and contacts the source and drain electrodes 105 and 106, and a gate insulating layer 108a insulates the gate electrode 104 from the source electrode 105, the drain electrode 106, and the organic semiconductor layer 107. The gate insulating layer 108a can be formed of an inorganic material, for example, silicon oxide or silicon nitride.

In the above structure, the TFT shown in FIG. 4 has an inverted coplanar structure, that is, the gate electrode 104 is formed on a substrate 102, the gate insulating layer 108a covers the gate electrode, the source and the drain electrodes 105 and 106 are formed on the gate insulating layer 108a, and the organic semiconductor layer 107 covers the source and drain electrodes 105 and 106.

Figure 1:
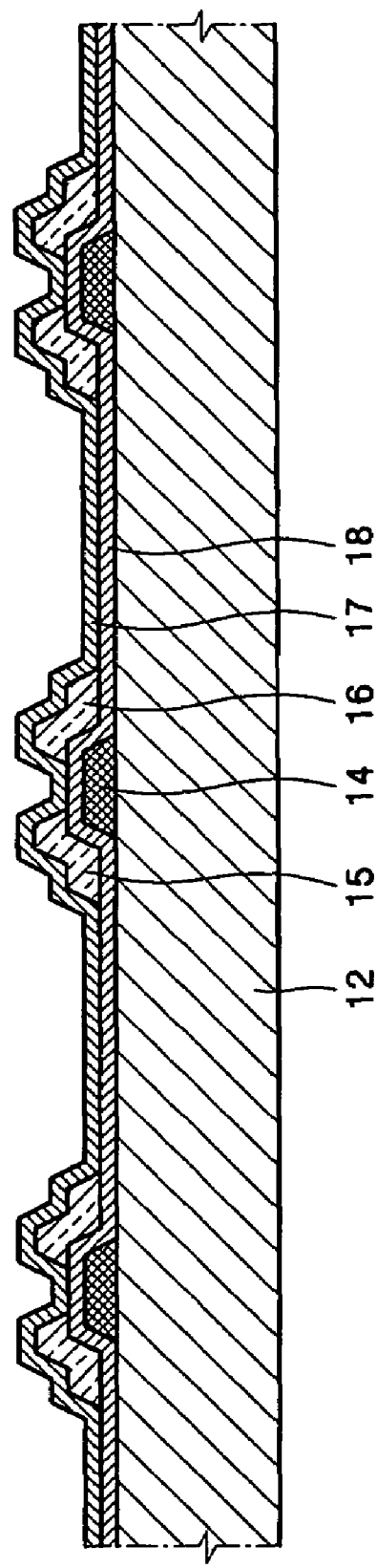
FIG. 1 is a schematic cross-sectional view of a conventional inverted coplanar organic thin film transistor (TFT).
Figure 2:
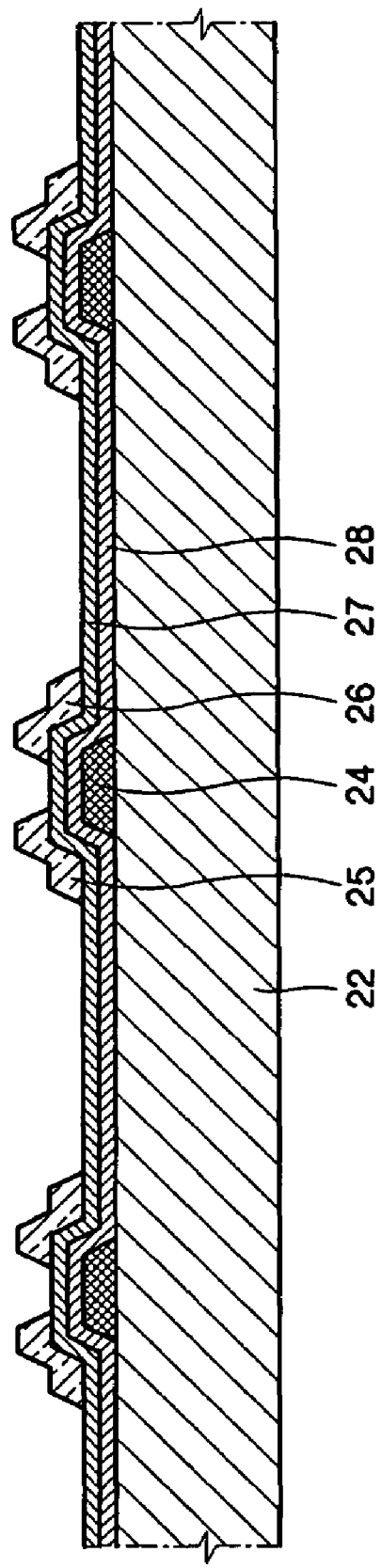
FIG. 2 is a schematic cross-sectional view of a conventional inverted staggered type organic TFT.
Figure 3:
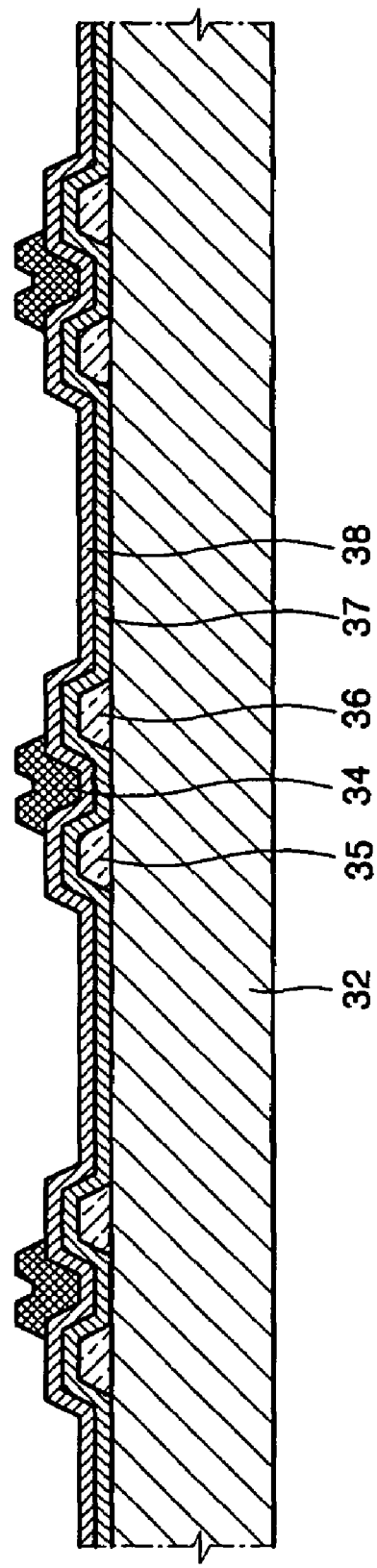
FIG. 3 is a schematic cross-sectional view of a conventional staggered type organic TFT.

One difference between the inverted coplanar type organic TFT according to the present invention and the conventional inverted coplanar type organic TFT shown in FIG. 1 is that the gate insulating layer 108a is patterned as an island shape. Further, portions of the gate insulating layer indicated by 108b in FIG. 4 that do not form the TFT may be patterned in an island shape. Thus, a gap 110 appears between the gate insulating layer 108a and each gate insulating layer portions 108b. Consequently, when the organic semiconductor layer 107 is deposited, portions of the organic semiconductor layer 107 fill the gaps while other portions of the organic semiconductor layer 107 cover the gate insulating portions 108b.

An advantage of patterning the gate insulating layer 108a as an island shape as shown in FIG. 4 is that the island shape reduces mechanical stress on the gate insulating layer 108a under conditions such as bending of the substrate 102, because the portions of the substrate 102 proximate to the gaps 110 can flex freely. Therefore, the deformation or separation of the organic TFT can be prevented.

If the adhesion between the gate insulating layer 108a and the substrate 102 is weak, bending the substrate 102 is especially likely to separate the gate insulating layer 108a from the substrate 102. Patterning the gate insulating layer 108a as an island shape helps to prevent separation from occurring.

Illustratively, the substrate 102 can be almost any flexible substrate, such as, but not limited to, a metal foil or a plastic substrate, for example.

The patterning of the gate insulating layer 108a is not limited to a certain shape. For example, as shown in FIG. 4, the gate insulating layer 108b is patterned on a portion where the organic TFT is not located. In addition, as shown in the inverted coplanar type organic TFT of FIG. 5 according to a second embodiment of the present invention, gate insulating layers 208a of two or more TFTs 211 and 212 can be formed integrally with each other and the gate insulating layer 208b of another TFT 214 can be formed independently, that is with a gap 210 separating it from gate insulating layer 208a. Illustratively, the gap 210 is filled with an organic semiconductor layer 207. Moreover, in FIG. 5, reference numeral 202 denotes a flexible substrate; reference numeral 204 denotes a gate electrode, reference numeral 205 denotes a source electrode; and reference numeral 206 denotes a drain electrode.

Figure 5:
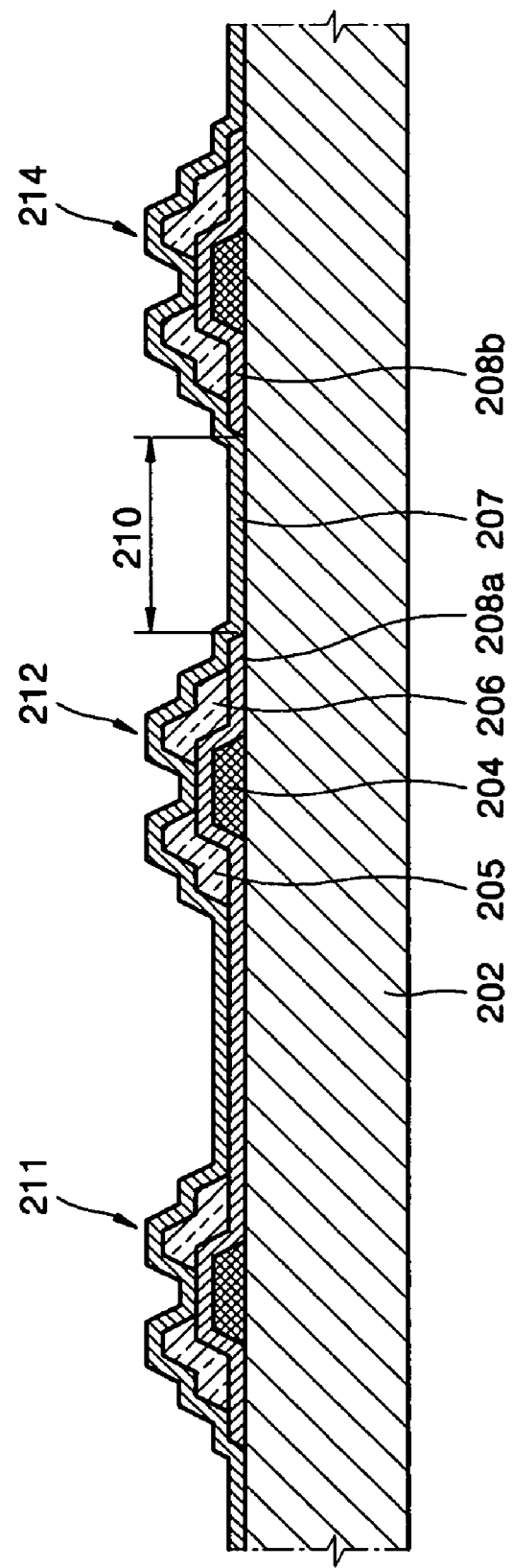
FIG. 5 is a schematic cross-sectional view of an inverted coplanar type organic TFT according to another embodiment of the present invention.

FIGS. 4 and 5 show only the inverted coplanar type organic TFT, however, the present invention can be applied to any type of organic TFT such as an inverted staggered type or staggered type, as well as the inverted coplanar type organic TFT if it has the gate insulating layer patterned as island shape. This also applies to the following embodiments.

The structure of the inverted staggered type organic TFT will be described as follows. The inverted staggered type organic TFT includes a gate electrode, a source electrode and a drain electrode insulated from the gate electrode, an organic semiconductor layer insulated from the gate electrode and contacting the source and drain electrodes, and a gate insulating layer insulating the gate electrode from the source electrode, the drain electrode, and the organic semiconductor layer. Thus, the above structure of the inverted staggered type organic TFT is the same as that of the inverted coplanar type organic TFT. Differences of the inverted staggered type organic TFT from the inverted coplanar type organic TFT are that the gate electrode is formed on the substrate, the gate insulating layer covers the gate electrode, the organic semiconductor layer is formed on the gate insulating layer, and the source and drain electrodes are formed on the organic semiconductor layer.

In addition, the structure of the staggered type organic TFT will be described as follows. The basic structure of the staggered type organic TFT is the same as that of the inverted coplanar type organic TFT or the inverted staggered type organic TFT. However, the source and drain electrodes are located on the substrate, the organic semiconductor layer covers the source and drain electrodes, the gate insulating layer is formed on the organic semiconductor layer, and the gate electrode is formed on the gate insulating layer.

In the inverted staggered type organic TFT, the gate insulating layer covering the gate electrode formed on the substrate is patterned in the island shape, reducing mechanical stress on the gate insulating layer and preventing deformation or separation of the organic TFT. In addition, in the staggered type organic TFT, the gate insulating layer located on the organic semiconductor layer is patterned in the island shape to reduce the mechanical stress on the gate insulating layer and prevent the deformation or separation of the organic TFT.

Figure 6:
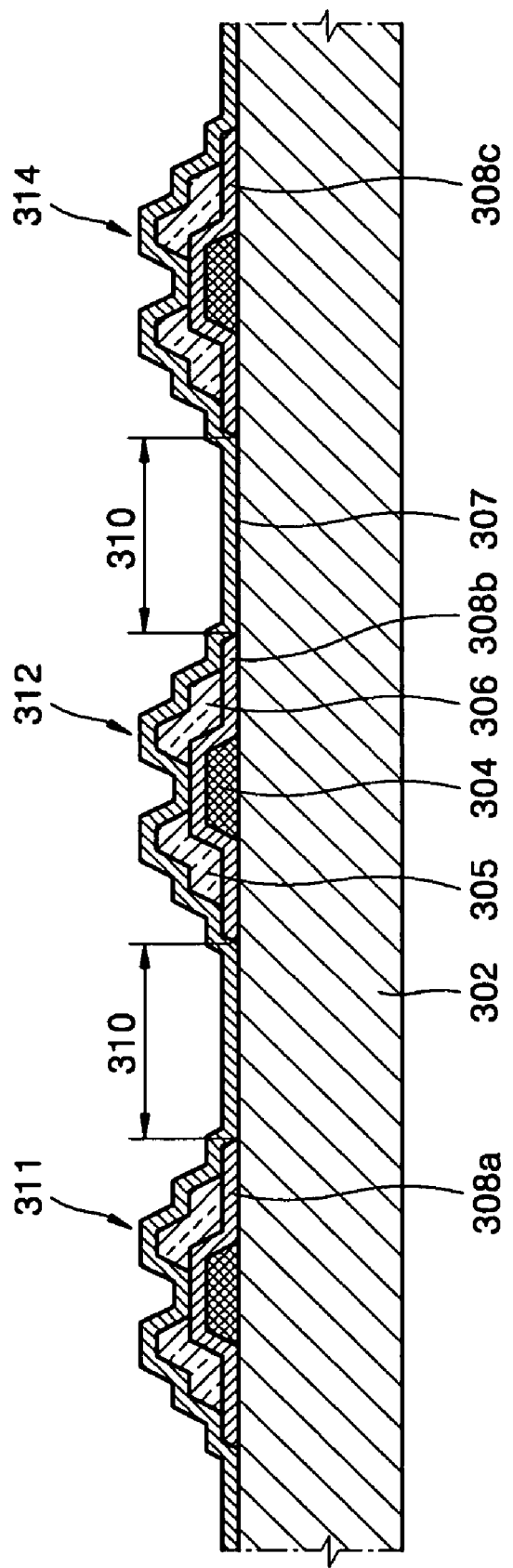
FIG. 6 is a schematic cross-sectional view of an inverted coplanar type organic TFT according to still another embodiment of the present invention.

FIG. 6 is a cross-sectional view of an inverted coplanar type organic TFT according to a third embodiment of the present invention. The inverted coplanar type organic TFT is different from the above inverted coplanar type organic TFTs in that gate insulating layers 308a, 308b, and 308c are patterned to correspond to each organic TFT 311, 312, and 314. Therefore, under mechanical stress such as bending of the substrate, stress on each gate insulating layer 308a, 308b, and 308c is reduced, to prevent the deformation or the separation of any of the organic TFTs 311, 312, and 314. For example, TFT 311 has a gate insulating layer 308a that is separated by a gap 310 from the gate insulating layer 308b of TFT 312. In turn, the gate insulating layer 308b of TFT 312 is separated by a gap 310 from the gate insulating layer 308C of TFT 314. Moreover, in FIG. 6, reference numeral 302 denotes a flexible substrate; reference numeral 304 denotes a gate electrode, reference numeral 305 denotes a source electrode; reference numeral 306 denotes a drain electrode, and reference numeral 307 denotes an organic semiconductor layer that covers the source and drain electrodes 305, 306 and fills the gaps 310 between gate insulating layers 308a, 308b, and 308c.

Figure 7:
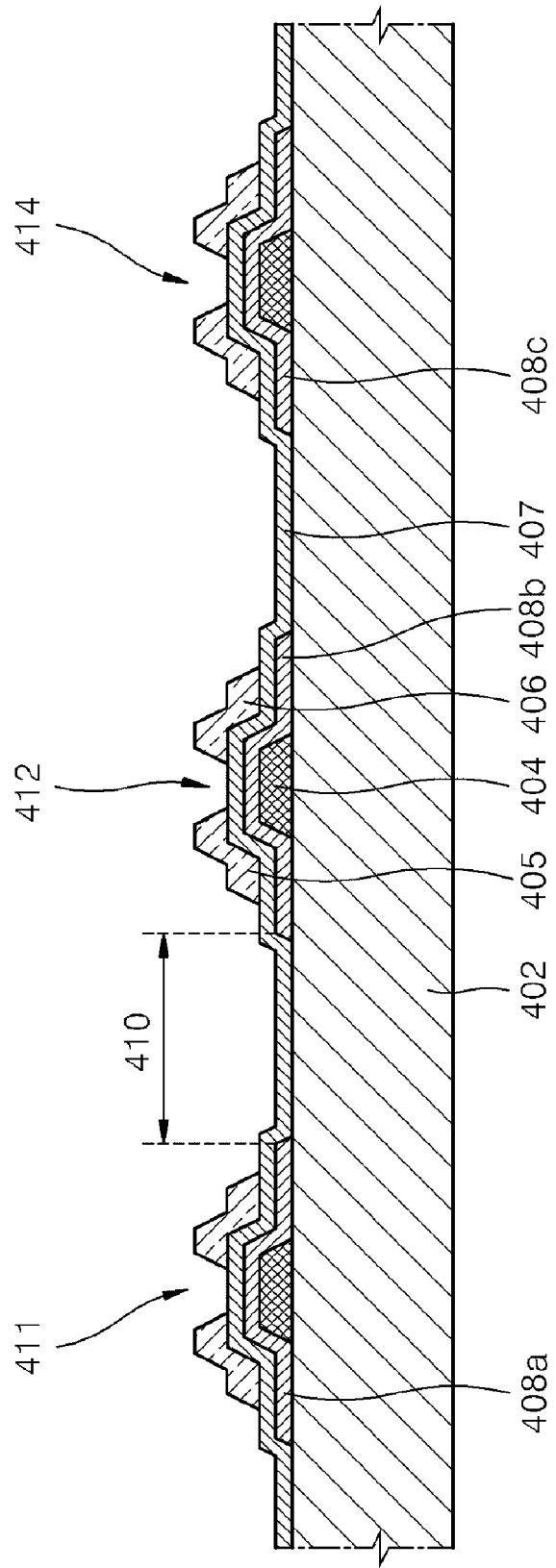
FIG. 7 is a schematic cross-sectional view of an inverted staggered type organic TFT according to the present invention.

FIG. 7 is a cross-sectional view of an inverted staggered type organic TFT according to a fourth embodiment of the present invention. Referring to FIG. 7, gate insulating layers 408a, 408b, and 408c are patterned to correspond to each organic TFT 411, 412, and 414. Therefore, under mechanical stress such as bending of the substrate, stress on each gate insulating layer 408a, 408b, and 408c is reduced, to prevent the deformation or the separation of any of the organic TFTs 411, 412, and 414. For example, TFT 411 has a gate insulating layer 408a that is separated by a gap 410 from the gate insulating layer 408b of TFT 412. In turn, the gate insulating layer 408b of TFT 412 is separated by a gap 410 from the gate insulating layer 408c of TFT 414. Moreover, in FIG. 7, reference numeral 402 denotes a flexible substrate; reference numeral 404 denotes a gate electrode, reference numeral 405 denotes a source electrode; reference numeral 406 denotes a drain electrode, and reference numeral 407 denotes an organic semiconductor layer that covers the source and drain electrodes 405, 406 and fills the gaps 410 between gate insulating layers 408a, 408b, and 408c.

Figure 8:
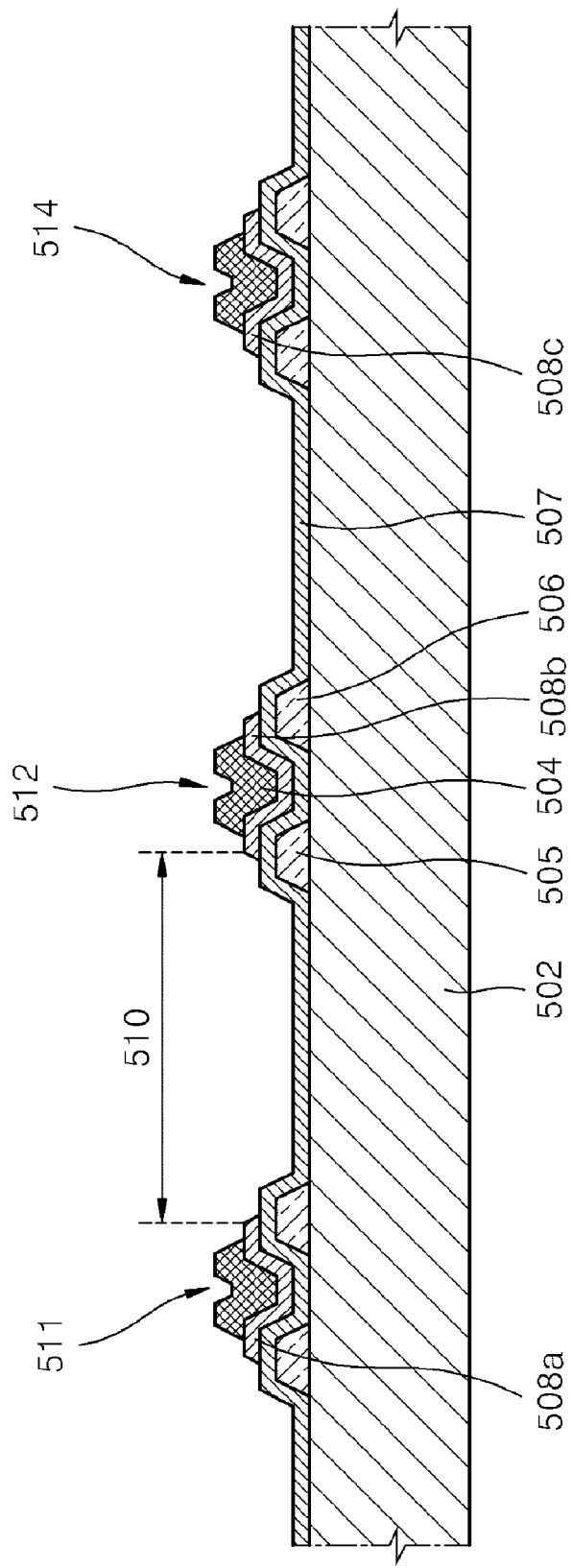
FIG. 8 is a schematic cross-sectional view of a staggered type organic TFT according to the present invention.

FIG. 8 is a staggered type organic TFT according to a fifth embodiment of the present invention. Referring to FIG. 8, gate insulating layers 508a, 508b, and 508c are patterned to correspond to each organic TFT 511, 512, and 514. Therefore, under mechanical stress such as bending of the substrate, stress on each gate insulating layer 508a, 508b, and 508c is reduced, to prevent the deformation or the separation of any of the organic TFTs 511, 512, and 514. For example, TFT 511 has a gate insulating layer 508a that is separated by a gap 510 from the gate insulating layer 508b of TFT 512. In turn, the gate insulating layer 508b of TFT 512 is separated by a gap 510 from the gate insulating layer 508C of TFT 514. Moreover, in FIG. 8, reference numeral 502 denotes a flexible substrate; reference numeral 504 denotes a gate electrode, reference numeral 505 denotes a source electrode; reference numeral 506 denotes a drain electrode, and reference numeral 507 denotes an organic semiconductor layer that covers the source and drain electrodes 505, 506 and fills the gaps 510 between gate insulating layers 508a, 508b, and 508c.

As described above, any of the organic TFTs disclosed herein may be formed in a flexible flat panel display device having a display element. The display element electrically connected to either the source or drain of the organic TFT reduces the mechanical compression stress on the gate insulating layer of the organic TFT, thereby preventing deformation or separation of the organic TFT. Flat panel display devices manufactured in this way are more reliable and last longer.

The flat panel display device can be a liquid crystal display (LCD) device or an electroluminescent (EL) display device.

The flat panel display device such as the LCD or EL display device may use a TFT such as one of those illustratively described above as a switching device for controlling the operation of the pixels, a driving device for each pixel, and as various other drivers. When the organic TFT is used as a driving TFT, a pixel electrode of a flat panel display device may be connected to either its source or drain electrode.

An organic TFT manufactured according to the principles of the claimed invention may be used efficiently in an EL display device, and the flat panel display device having this structure will be described as follows.

Illustratively, the EL display device may have various pixel patterns that vary according to the light to be emitted from an emitting layer that includes, for example, red, green, and blue sub-pixels. The sub-pixels of red, green, and blue colors may each include an EL device that is a self-emissive device and which connects to one or more organic TFTs such as those described above. A capacitor can also be included in each pixel.

The EL element is a current-driving type emitting device that will emit red, green, or blue light according to the current flowing between two electrodes forming the EL element. When viewed as a whole, the plurality of pixels may display an image. The EL element includes a pixel electrode that is connected to either the source or drain electrode of the TFT, a counter electrode covering all the pixels or each pixel individually, and an interlayer including at least a light emitting layer, formed between the pixel electrode and the counter electrode. However, the present invention is not limited to the above structure, and various structures of EL element may also be used.

The pixel electrode may function as an anode electrode, and the counter electrode may function as a cathode electrode. However, the polarities of the pixel electrode and the counter electrode may be reversed.

The pixel electrode may be a transparent electrode or a reflective electrode. If the pixel electrode is a transparent electrode, it may be formed of indium tin oxide (ITO), indium zinc oxide (IZO), ZnO, or $In_2O_3$. If the pixel electrode is a reflective electrode, it may be fabricated by forming a reflective layer using Ag, Mg, Al, Pt, Pd, Au, Ni, Nd, Ir, Cr, or a compound thereof, and applying ITO, IZO, ZnO, or $In_2O_3$ thereon.

The counter electrode also may be a transparent electrode or a reflective electrode. If the counter electrode is a transparent electrode, Li, Ca, LiF/Ca, LiF/Al, Al, Ag, Mg, or a compound thereof is deposited to face the interlayer, followed by a sub-electrode layer or a bus electrode line of ITO, IZO, ZnO, or $In_2O_3$. If the counter electrode is a reflective electrode, Li, Ca, LiF/Ca, LiF/Al, Al, Ag, Mg, or a compound thereof is deposited. However, the present invention is not limited thereto, and the pixel electrode and the counter electrode may be formed of an organic material such as a conductive polymer.

The EL element may be classified as either an inorganic EL element or an organic EL element, depending on whether the interlayer is an inorganic layer or an organic layer. An organic interlayer may be a low molecular organic layer or a high molecular organic layer.

If the low molecular organic layer interlayer is used, it may include a hole injection layer (HIL), a hole transport layer (HTL), an emission layer (EML), an electron transport layer (ETL), and an electron injection layer (EIL) in single or multiple layers. In addition, the low molecular organic layer may be formed of copper phthalocyanine (CuPc), N,N-di (naphthalene-1-yl)-N,N'-diphenyl-benzidine (NPB), or tris-8-hydroxyquinoline aluminum (Alq3). The low molecular organic layer may be formed by heating and depositing the organic material under a vacuum. The structure of the interlayer is not limited to the above structure, and various other layers may be included.

If the high molecular organic layer interlayer is used, it may include an HTL and an EML. The high molecular HTL may be formed by inkjet printing or spin coating using poly-(2,4)-ethylene-dihydroxy thiophene (PEDOT) or polyaniline (PANI). The high molecular EML can be formed of PPV, soluble PPV's, Cyano-PPV, or polyfluorene, and the color pattern of the high molecular EML may be formed by inkjet printing, spin coating, or thermal transfer using a laser. The structure of the interlayer is not limited to the above structure, and the interlayer can be formed by including various other layers if necessary.

The inorganic EL element uses an inorganic interlayer, which may include the EML and an insulating layer disposed between the EML and the electrode. The structure of the interlayer is not limited thereto.

The EML may be formed of a metal sulfide such as ZnS, SrS, and CaS or an alkaline earth potassium sulfide such as $CaGa_2S_4$ and $SrGa_2S_4$, and emission core atoms such as transition metals or alkaline rare earth metals including Mn, Ce, Tb, Eu, Tm, Er, Pr, and Pb.

In the EL element having the above structure, one or more organic TFTs, on which the gate insulating layer is patterned, are connected to the pixel electrode of the EL element to control the flow of current through the pixel electrode, thus controlling the emission of each pixel.

Figure 9:
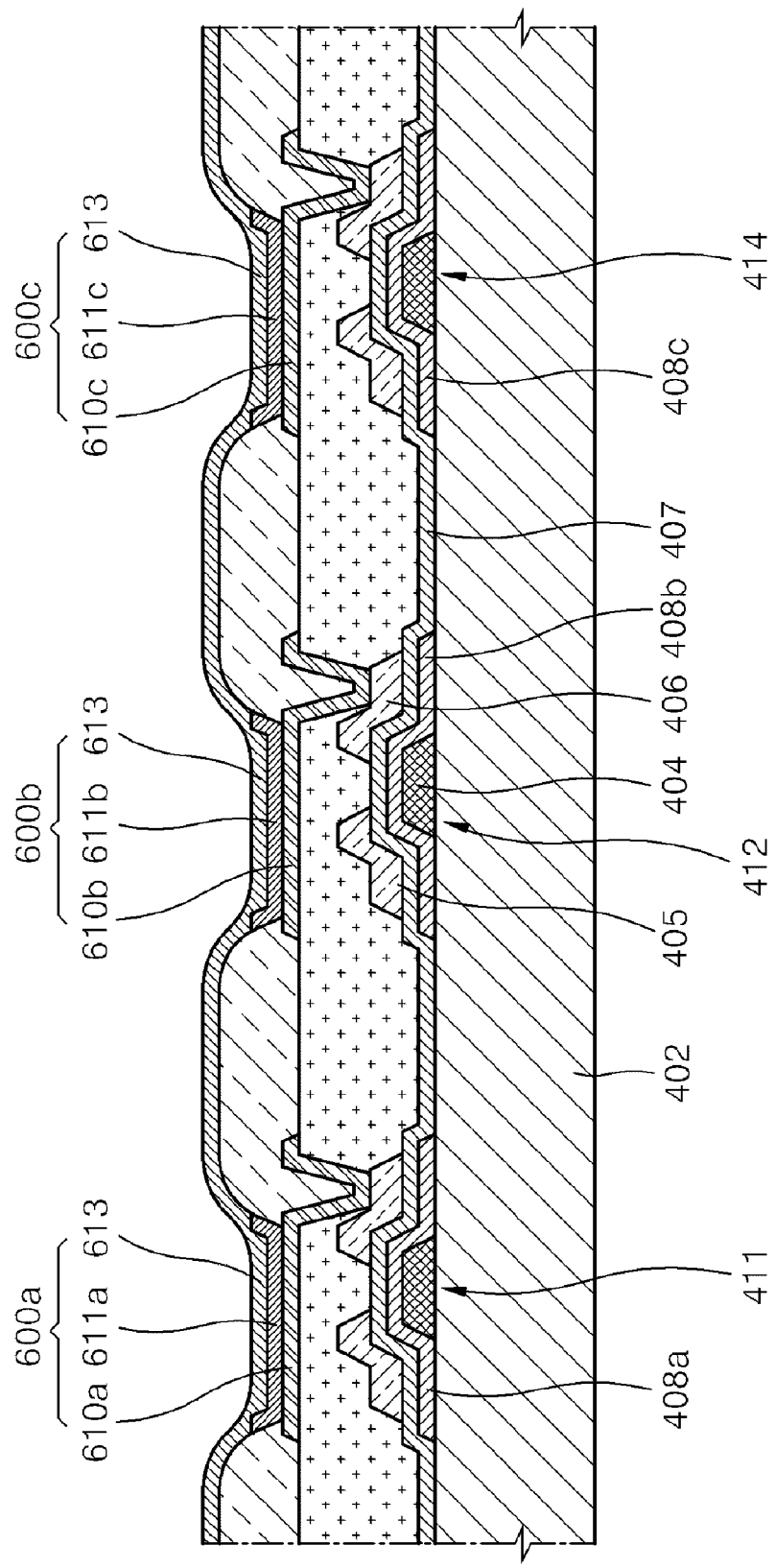
FIG. 9 is a schematic cross-sectional view of a flat panel display device including the inverted staggered type organic TFT shown in FIG. 7.

As an example of a flat panel display device, FIG. 9 is a schematic cross-sectional view of a flat panel display device including the inverted staggered type organic TFT shown in FIG. 7. As shown in FIG. 9, organic TFTs 411, 412, and 414 may be respectively connected to EL elements 600a, 600b, and 600c as display elements. EL element 600a includes a pixel electrode 610a connected to either a source electrode 405 or drain electrode 406 of organic TFT 411, a counter electrode 613 opposing the pixel electrode 610a, and an interlayer 611a arranged between the pixel electrode 610a and the counter electrode 613. EL element 600b includes a pixel electrode 610b connected to either a source electrode 405 or drain electrode 406 of organic TFT 412, a counter electrode 613 opposing the pixel electrode 610b, and an interlayer 611b arranged between the pixel electrode 610b and the counter electrode 613. EL element 600c includes a pixel electrode 610c connected to either a source electrode 405 or drain electrode 406 of organic TFT 414, a counter electrode 613 opposing the pixel electrode 610c, and an interlayer 611c arranged between the pixel electrode 610c and the counter electrode 613. The interlayers 611a, 611b, and 611c each include at least a light emitting layer to emit one of red, green, and blue light.

In addition, the organic TFT may be formed on an LCD, and the structure of the LCD device will be described as follows.

Alignment layers for aligning a liquid crystal layer are located between a first substrate and a second substrate that face each other. A first electrode is formed between the alignment layer and the first substrate, a second electrode is formed between the alignment layer and the second substrate, and a color filter layer is formed between the second substrate and the second electrode.

A first light polarizing layer is formed on the surface of the first substrate opposite the second substrate, and a second light polarizing layer is formed on the surface of the second substrate opposite the first substrate. In addition, a protective film is formed on the second light polarizing layer.

In the LCD device of the above structure, the first electrode is connected to the organic TFT, on which the gate insulating layer is patterned, to generate an electric potential difference between the first and second electrodes due to an external signal controlled by the organic TFT. In addition, the arrangement of the liquid crystal layer is determined by the electric potential difference, and visible rays supplied from a back light unit (BLU) located on a lower portion of the first substrate is blocked or transmitted according to the arrangement of the liquid crystal layer. When the transmitted light passes through the color filter layer, the image is displayed.

The organic TFT of the present invention may be applied to various flat panel display devices besides the EL display device and the LCD device. In addition, the organic TFT can be adopted in all devices which use TFTs, such as electronic sheets, smart cards, smart tags, and RFID devices.

In the flat panel display device having the above structure, the patterning of the gate insulating layer that forms the organic TFT included in the flat panel display device is not limited to a certain patterning shape, but can be a discretionary island-shape type patterning. As described above, when the gate insulating layer of the organic TFT included in the flat panel display device is patterned in the island shape, mechanical stress on the gate insulating layer due to mechanical shocks such as bending of the substrate is reduced. In addition, the deformation or separation of the organic TFT may be prevented, thus improving the reliability and life span of a flat panel display device.

According to an aspect of the claimed invention, the display device in the flat panel display device may have one or more organic TFTs, and the gate insulating layer may be patterned to correspond to the each organic TFT. In addition, the display device may emit red, green, or blue light; thus the gate insulating layer may be patterned so as to correspond to each display device, that is, each sub-pixel. Otherwise, the gate insulating layer may be patterned so as to correspond to three display devices emitting red, green, and blue light respectively, that is, to correspond to each pixel. In such a configuration, the mechanical stress on the gate insulating layer due to mechanical shocks such as bending of the substrate may be reduced. In addition, the deformation and separation of the organic TFT may be prevented, thus improving the reliability and life span of the flat panel display device.

The organic TFT and the flat panel display device including the organic TFT of the present invention may obtain the following effects.

Since the gate insulating layer is patterned in the island shape, mechanical stress on the gate insulating layer can be reduced when mechanical shock such as bending of the substrate occurs, preventing the deformation or separation of the organic TFT.

In addition, the claimed invention prevents the gate insulating layer and the substrate from separating, even when their adhesion is not strong.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic thin film transistor substrate, comprising a first organic thin film transistor and a second organic thin film transistor, wherein the first organic thin film transistor comprises:
   a first gate electrode;
   a first source electrode and a first drain electrode insulated from the first gate electrode;
   a first organic semiconductor layer insulated from the first gate electrode, and contacting the first source electrode and the first drain electrode; and
   a first gate insulating layer insulating the first gate electrode from the first source electrode, the first drain electrode, and the first organic semiconductor layer,
   wherein the second organic thin film transistor comprises a second gate insulating layer insulating a second gate electrode from a second source electrode, a second drain electrode, and a second organic semiconductor layer, and
   wherein the first gate insulating layer is disconnected from the second gate insulating layer.

2. The organic thin film transistor substrate of claim 1, wherein the first gate insulating layer is formed of an inorganic material.

3. The organic thin film transistor substrate of claim 2, wherein the first gate insulating layer is patterned to correspond to only the first organic thin film transistor.

4. The organic thin film transistor substrate of claim 1, wherein the first gate electrode is located on the organic thin film transistor substrate, the first gate insulating layer covers the first gate electrode, the first source electrode and the first drain electrode are formed on the first gate insulating layer, and the first organic semiconductor layer covers the first source electrode and the first drain electrode.

5. The organic thin film transistor substrate of claim 4, wherein the first gate insulating layer is patterned to correspond to only the first organic thin film transistor.

6. The organic thin film transistor substrate of claim 1, wherein the first gate electrode is formed on the organic thin film transistor substrate, the first gate insulating layer covers the first gate electrode, the first organic semiconductor layer is formed on the first gate insulating layer, and the first source electrode and the first drain electrode are formed on the first organic semiconductor layer.

7. The organic thin film transistor substrate of claim 6, wherein the first gate insulating layer is patterned to correspond to only the first organic thin film transistor.

8. The organic thin film transistor substrate of claim 1, wherein the first source electrode and the first drain electrode are formed on the organic thin film transistor substrate, the first organic semiconductor layer covers the first source electrode and the first drain electrode, the first gate insulating layer is formed on the first organic semiconductor layer, and the first gate electrode is formed on the first gate insulating layer.

9. The organic thin film transistor substrate of claim 8, wherein the first gate insulating layer is patterned to correspond to only the first organic thin film transistor.

10. The organic thin film transistor substrate of claim 1, wherein the organic thin film transistor substrate is a flexible substrate.

11. The organic thin film transistor substrate of claim 10, wherein the first gate insulating layer is patterned to correspond to only the first organic thin film transistor.

12. The organic thin film transistor substrate of claim 1, wherein the first gate insulating layer is patterned to correspond to only the first organic thin film transistor.

13. The organic thin film transistor substrate of claim 1, wherein the first organic semiconductor layer and the second organic semiconductor layer are continuous between the first organic thin film transistor and the second organic thin film transistor.

14. The organic thin film transistor substrate of claim 1, further comprising a third gate insulating layer disposed in an area where no organic thin film transistor is disposed, the third gate insulating layer being disconnected from the first gate insulating layer and the second gate insulating layer.

15. A flat panel display device, comprising:
   an organic thin film transistor substrate comprising a first organic thin film transistor and a second organic thin film transistor, wherein the first organic thin film transistor comprises:
   a first gate electrode;
   a first source electrode and a first drain electrode insulated from the first gate electrode;
   a first organic semiconductor layer insulated from the first gate electrode, and contacting the first source electrode and the first drain electrode;
   a first gate insulating layer insulating the first gate electrode from the first source electrode, the first drain electrode, and the first organic semiconductor layer; and
   a display element electrically connected to at least one of the first source electrode and the first drain electrode,
   wherein the second organic thin film transistor comprises a second gate insulating layer insulating a second gate electrode from a second source electrode, a second drain electrode, and a second organic semiconductor layer, and
   wherein the first gate insulating layer is disconnected from the second gate insulating layer.

16. The flat panel display device of claim 15, wherein the first gate insulating layer is patterned to correspond to only the first organic thin film transistor including the first source electrode, the first drain electrode, and the first gate electrode.

17. The flat panel display device of claim 15, wherein the display element emits one of red, green, and blue light, and the first gate insulating layer is patterned to correspond to only the first display element.

18. The flat panel display device of claim 15, wherein the display element emits one of red, green, and blue light, and the first gate insulating layer is patterned to correspond to three neighboring display elements, which respectively emit red, green, and blue light.

19. The flat panel display device of claim 15, wherein the display element is an electroluminescent element.

20. The flat panel display device of claim 15, wherein the first organic semiconductor layer and the second organic semiconductor layer are continuous between the first organic thin film transistor and the second organic thin film transistor.

21. The flat panel display device of claim 15, further comprising a third gate insulating layer disposed in an area where no organic thin film transistor is disposed, the third gate insulating layer being disconnected from the first gate insulating layer and the second gate insulating layer.

* * * * *